United States Patent

Hill

[11] Patent Number: 4,593,246
[45] Date of Patent: Jun. 3, 1986

[54] NMR TUNING PROCEDURE

[75] Inventor: Howard D. Hill, Cupertino, Calif.

[73] Assignee: Varian Associates, Inc., Palo Alto, Calif.

[21] Appl. No.: 650,324

[22] Filed: Sep. 12, 1984

[51] Int. Cl.[4] ............................................. G01R 33/20
[52] U.S. Cl. ..................... 324/307; 324/58 B; 324/318
[58] Field of Search ................. 364/482; 455/115; 324/74, 300, 307, 318, 322, 58 R, 58 A, 58 B, 58 C, 58.5 B, 63

[56] References Cited

U.S. PATENT DOCUMENTS

| 3,445,763 | 5/1969 | Harris, Jr. | 364/482 |
| 3,792,345 | 2/1974 | Hawkins | 324/307 |
| 3,904,959 | 9/1975 | Britton | 324/58 B |
| 4,196,475 | 4/1980 | Hall | 364/482 |
| 4,300,092 | 11/1981 | Strenglein | 324/58 B |

Primary Examiner—Michael J. Tokar
Attorney, Agent, or Firm—Stanley Z. Cole; Edward H. Berkowitz

[57] ABSTRACT

The RF probe of a quadrature sensitive FT-NMR spectrometer is tuned and matched to its electrical environment by utilizing the phase quadrature sensitivity of said spectrometer to function as an impedance vector analyzer for the probe in situ. Phase and amplitude measurements of the in situ probe are compared to an occasionally measured and stored amplitude and phase characteristic observed when the probe is replaced by a 50 ohm terminator.

4 Claims, 4 Drawing Figures

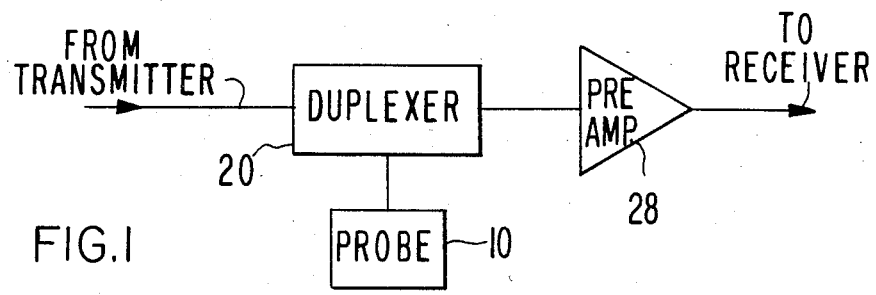
FIG.1
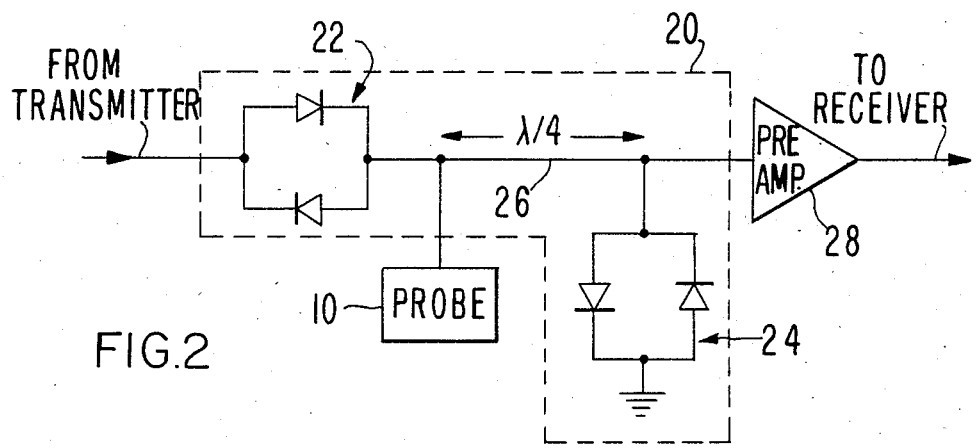
FIG.2
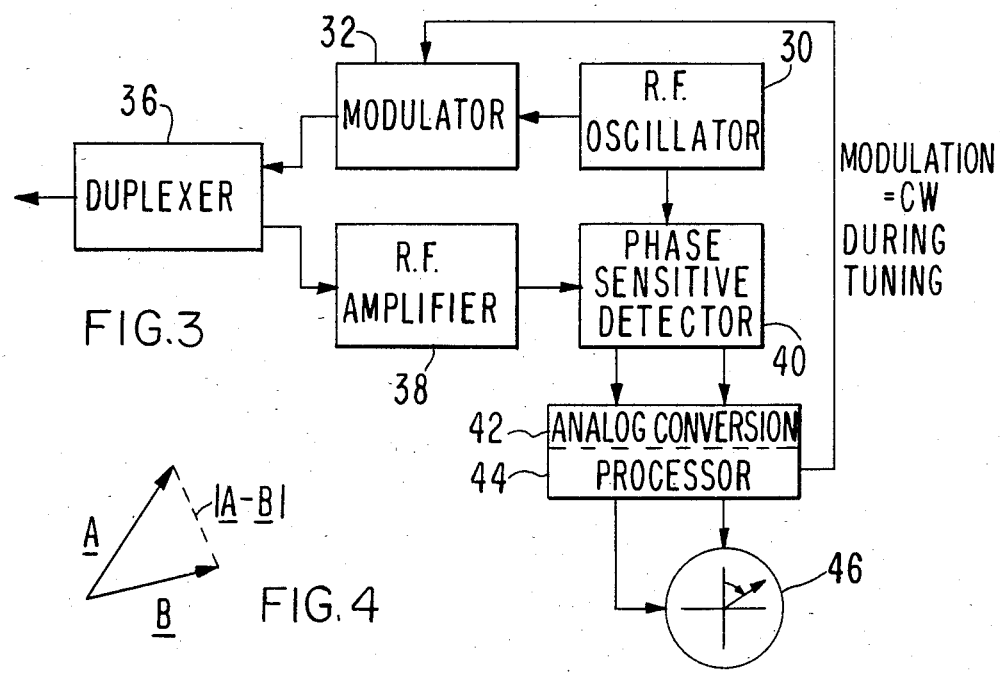
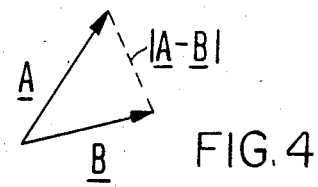
FIG.3
FIG.4

NMR TUNING PROCEDURE

The present invention relates to Fourier transform NMR spectroscopy and, in particular, to the tuning and impedance matching of the sample probe of such apparatus.

The sample probe of a modern Fourier transform nuclear magnetic resonance spectrometer couples an RF transmitter to a sample and also couples said sample to an RF receiver. The probe must be matched to the coupling network by careful tuning procedures. Owing to the crucial role of the probe for excitation and detection of nuclear resonance, probe performance is often the limiting factor of spectrometer performance. The procedure of the present invention is best illustrated with the aid of FIGS. 1 and 2 wherein probe 10 communicates with the receiver channel and transmitter channel through duplexer 20. In one common arrangement, duplexer 20 comprises back to back diode pairs 22 and 24 and quarter wavelength transmission line 26. Ordinarily, the transmission line of the quarter wavelength strip exhibits a characteristic impedance of 50 ohms at the operating frequency. Preamplifier 28 is designed to exhibit a minimum noise figure for this input impedance. The problem of matching the probe to the correct impedance has, in prior art, been accomplished with reconfiguration of the physical connection to the probe. Very accurate procedures employ a vector impedance analyzer, or using another approach, a directional coupler or standing wave bridge is inserted in the system to monitor reflected power while tuning the probe to minimize same. Still another approach relies upon injection of a signal onto the decoupler coil of the probe. The probe is tuned to maximize the signal induced on the signal coil within the probe structure, the latter disposed in proximity to the decoupler coil. This approach does not maximize signal-to-noise performance of the system because the signal output can be maximized with the preamplifier while the preamplifier remains unmatched to its input.

These tuning methods require certain changes to the probe connections which are inconvenient, at best, and certainly do not correspond to normal operation.

BRIEF DESCRIPTION OF THE INVENTION

According to the present invention, tuning of the probe is carried out in situ by reference to the phase and amplitude of a signal transmitted to the network of FIGS. 1 and 2. Phase and amplitude are each functions of the impedance which are readily determined from conventional quadrature resolving FT instruments. In this way, the FT-NMR spectrometer functions as a whole in the role of a vector impedance analyzer. Tuning procedure is calibrated occasionally by substitution of a 50 ohm termination for the probe and comparison of the phase and amplitude response therewith to the phase and amplitude response when the probe is replaced.

BRIEF DESCRIPTION OF THE FIGURES

FIG. 1 schematically describes a probe configuration for an RF spectrometer.

FIG. 2 illustrates a duplexer for the apparatus of FIG. 1.

FIG. 3 is a block diagram of subsystems of a Fourier transform RF spectrometer.

FIG. 4 represents the object on which the two parameter minimization operates.

DETAILED DESCRIPTION OF THE INVENTION

A typical block diagram of pertinent portions of an FT-NMR spectrometer appears in FIG. 3. An RF oscillator 30 is modulated by modulator 32 and the signal is directed through duplexer 34 to the probe 36. The signal output of the probe presented to duplexer 34 is directed to RF amplifier 38. Phase sensitive detector 40 operates on a reference phase derived from the RF oscillator 30 and the RF amplifier output signal to resolve the RF amplifier signal into phase quadrature components by incorporating two phase detectors fed with reference signals at the same frequency but differing in phase by 90°. For a signal frequency exactly equal to the reference frequency, the quadrature detection method provides independent determination of two quadrature components of the signal. Analog to digital conversion 42 operates on the phase sensitive detector outputs and the digital signals are available for further processing by processor apparatus 44.

The present timing procedure measures two parameters, phase and amplitude, rather than the single parameter techniques of prior art such as signal peaking, reflected wave nulling and the like. The two channels of the quadrature resolving receiver are ideally suited for processing of the relevant information and storage in the spectrometer memory.

Note that during operation according to the present invention the modulator 32 may be considered bypassed in the operational sense. The RF carrier is applied through the duplexer to the probe 10 or a probe substitute in the preferred from of a standard 50 ohm termination.

First consider the substitution of the 50 ohm termination for the probe. There is then derived a signal represented by a vector A defined by the quadrature components from the outputs of the quadrature phase detector. With the termination removed and the probe in place, the same procedure generally yields a signal B. The vector A is preferably retained and vector difference A−B is then observed while adjustment of the probe is carried out through the tune and match capacitances of the probe. If the magnitude of the vector difference, $|A-B|$, is displayed by the spectrometer display 46, the tuning procedure proceeds by a minimization process much as in the case of reducing reflected power by minimizing the difference signal. This very simple technique is suitable for manual operation referenced to a null meter.

The method described is also capable of implementation under control of the spectrometer control processor. Here it is noted that a single parameter minimization, as indicated above, is but one precedure effective for the case of a computer controlled matching process; a two parameter minimization of the vector difference A−B can yield a more rapid convergence as in FIG. 4. In a simple technique, one vector (A) is arbitrarily assigned a phase $\phi A$ and the magnitude is taken from the 50 ohm termination data store by the processor. The magnitude $|B|$ and phase difference $\phi B - \phi A$ is measured. The magnitude of the vector difference $|A-B|$ is then minimized either manually by operator interaction via the display 46, or automatically by a suitable search procedure for function minimization.

It will be appreciated that the above described procedure is not limited to the context of a specific NMR Fourier transform spectrometer, buy may be employed wherever the elements of transmitter, receiver and RF signal probe are operable in conjunction with a quadrature sensitive processing system akin to the present subject matter. While the above description represents a particular embodiment and has been so illustrated and described, modifications and changes will become apparent to those skilled in the art and it is intended to cover in the appended claims all such modifications and changes as come within the spirit and scope of the invention.

What is clamed is:

1. A method of adjusting a variable impedance RF probe of a quadrature sensitive Fourier transform NMR spectrometer, comprising the steps of:
   (a) directing a continuous wave RF signal to a network including a terminating fixed impedance of known characteristic in place of said variable impedance RF probe,
   (b) obtaining and storing the amplitude of said signal affected by said terminating fixed impedance,
   (c) detecting in quadrature and storing the phase of said affected signal in relation to the phase of said transmitted signal, whereby a first impedance vector is derived and retained,
   (d) replacing said fixed terminating impedance with said variable impedance RF probe,
   (e) next directing a continuous wave RF signal to said variable impedance RF probe, obtaining and storing the amplitude of said signal affected by said variable impedance RF probe and detecting in quadrature and storing the phase of said variable impedance RF probe affected signal in relation to the phase of the continuous wave RF signal applied thereto to obtain a second impedance vector characterizing the presence of said variable impedance probe, and
   (f) altering the amplitude and phase of the signal affected by said variable impedance RF probe by varying electrical parameters of said probe to minimized a function of said first and second impedance vectors.

2. The method of claim 1 comprising forming said function from the absolute magnitude of the difference of said first and second impedance vectors.

3. The method of claim 1 comprising forming said function from the vector difference of said first and second impedenance vectors.

4. The method of claim 2 or 3 comprising displaying said function of said first and second impedance vectors.

* * * * *